United States Patent [19]

Goforth

[11] Patent Number: 4,597,179

[45] Date of Patent: Jul. 1, 1986

[54] COMPONENT LEAD PROCESSOR TRIMMING AND FORMING TOOL

[76] Inventor: Sidney Goforth, 1262 N. Sugar Sands Blvd., Singer Island, Fla. 33404

[21] Appl. No.: 703,040

[22] Filed: Feb. 19, 1985

Related U.S. Application Data

[63] Continuation-in-part of Ser. No. 490,120, Apr. 29, 1983, abandoned.

[51] Int. Cl.⁴ .............................................. B26B 13/00
[52] U.S. Cl. ....................................... 30/233; 30/241; 81/9.51; 83/613
[58] Field of Search ................. 30/241, 242, 243, 233, 30/226, 131, 113; 83/613; 81/9.51

[56] References Cited

U.S. PATENT DOCUMENTS

| | | | |
|---|---|---|---|
| 2,428,490 | 10/1947 | Goughnour | 30/131 |
| 2,513,075 | 6/1950 | Youngstrand | 83/613 X |
| 2,850,802 | 9/1958 | Broske | 30/226 |
| 3,333,338 | 8/1967 | Burns | 30/233 |
| 3,337,953 | 8/1967 | Halstead | 30/233 |
| 3,370,353 | 2/1968 | Weissman | 30/233 |
| 3,465,932 | 9/1969 | Freeman | 30/241 |
| 3,771,207 | 11/1973 | Campbell | 30/233 X |
| 3,916,733 | 11/1975 | Meadows | 81/9.51 |
| 4,158,914 | 6/1979 | Kurtz | 30/233 |
| 4,271,593 | 6/1981 | Smith | 30/233 |

Primary Examiner—Jimmy C. Peters
Attorney, Agent, or Firm—Robert J. Van Der Wall

[57] ABSTRACT

There is provided a device which is principally used for trimming to a predetermined length the leads on electronics components prior to their insertion and connection to a printed circuit board. The device comprises a housing, in which is disposed positioning means and a movable plunger to which is attached a cutter blade. Also in contact therewith are resilient urging means to maintain close contact for effective shear cutting between the cutter blade and a die removably, but in fixed position, attached to the housing. The die incorporates holes or perforations into which the component leads are inserted for trimming, a plurality of holes normally being utilized in positions that correspond to the position of such leads on said component. The die is also a predetermined thickness, which thickness establishes the lengths to which the leads are trimmed in accordance with the specifications and thickness of the PC board to which the component will subsequently be soldered. The holes or perforations in the die will preferably be staggered or disposed in an angular orientation to the linear motion of the cutter blade with respect to the die such that each component lead will be severed in an identical angle, and in timed sequence to equalize the pressure required to do so throughout the stroke of the cutter blade.

7 Claims, 3 Drawing Figures 4,597,179

COMPONENT LEAD PROCESSOR TRIMMING AND FORMING TOOL

CROSS-REFERENCE TO RELATED APPLICATION

This application is a continuation-in-part of my copending application entitled Manually Operated Component Lead Processor Trimming and Forming Tool, Ser. No. 490,120, filed Apr. 29, 1983, now abandoned.

FIELD OF THE INVENTION

This invention relates to the field of tools for the solid state electronics manufacturing industry, and, more specifically, concerns a device for trimming and forming the electrical conductors, called leads, that are connected to and project from such electronic components as integrated circuit sockets, transistors, capacitors, resistors and the like.

BACKGROUND OF THE INVENTION

Not many years ago the solid state electronics manufacturing industry was a fraction of the size that it is at present notwithstanding the development of integrated circuits and transistors. However, since the development of miniaturization of integrated circuits in the form of semiconductor chips, there has been enormous growth in this industry. At the same time, mass production techniques have been increasingly applied in the manufacturing and assembly of electronics apparatus to reduce costs and increase output.

It is well known in the electronics trade that the assembly of printed circuit boards, commonly termed PC boards, that the thickness of the PC boards vary, and that the components that are installed into PC boards such as integrated circuit sockets, resistors, capacitors, transistors and the like are all manufactured with random length electrical conductors commonly referred to as leads or pins. These pins are plugged into holes that are designed into the PC board which holes contain in their inside diameter other conductors connected to the printed circuit on the PC board. When the pins are plugged into the holes in the PC board, they are soldered in place, thereby establishing permanent electrical communication between the lead or pin of the component and the correspondent portion of the printed circuit. Since the manufacturing specifications provide that the pins only extend through the PC board a particular distance, random length pins that exceed the specification have to be trimmed.

This is frequently accomplished in facilities that utilize mass production techniques with automatic or semi-automatic trimming and forming equipment that may utilize solenoids, pneumatic cylinders for movement and placement of the cutting apparatus, etc. Alternatively, the trimming and forming device can be manually operated, particularly in locations where electrical wiring and/or pneumatic air lines are cumbersome to arrange or the power sources are inaccessible. Similarly, in non-automated operations such as the assembly of low-volume items or, more particularly, prototypes (often called "breadboarding"), the use of manually operated tools to trim and form the leads of these components represents the only practical approach.

A substantial amount of inventive activity has been devoted to the design of such manually operated tools. Though various names are utilized for such tools, examples of patents that have been granted on such devices include those disclosed by Smith, U.S. Pat. Nos. 4,271,593; Burns, 3,333,338; Halstead, et al., 3,337,953; and Weissman, et al., 3,370,353. It will be seen from these disclosures that such devices have usually been designed with handles that move the cutting surfaces thereof about a single axis in the manner of a pliers, sometimes with spring means to open the handles thereof when pressure is not being applied. Such devices normally contain a plurality of holes in a blade or jaw into which a plurality of leads can be inserted for simultaneous trimming. Indeed, similar apparatus has been invented in the form of a hand shear for opening dispensing cartridges, as disclosed by Kurtz, U.S. Pat. No. 4,158,914. In addition, in some of the foregoing references, interchangeable dies or spacers can be inserted into the disclosed tools whereby predetermined lengths of the leads remain after trimming has been accomplished.

One definite disadvantage of all of these inventions is a consequence of the pivoting motion between the blades or cutting surfaces, i.e., the plurality of leads being trimmed and formed are not all cut at the same angle for a fixed orientation of the component to which the leads are attached. This is because the pivoting or rotational motion of such devices necessarily result in a different cutting angle for each lead because the dies are incapable of trimming all of the leads at the same distance from the axis of rotation of the tool. What results is non-uniformity in the manner in which the leads are trimmed. This difficulty is aggravated by the varying force required as the cutting surfaces or blades pass through their operative arc, because it is in the nature of the geometry of such devices that multiple leads have to be cut at the same moment in certain positions and no leads are cut at certain other positions.

The present inventor has determined that these difficulties may be overcome utilizing linear rather than pivoting or rotational motion between the cutting surfaces. Moreover, the use of linear motion between the cutting surfaces in combination with staggered positioning of the holes in the die can provide for only one lead at a time in a perfectly sequenced succession leading to substantially consistent force that is applied to the cutting surfaces to accomplish trimming of each lead in a uniform manner.

SUMMARY OF THE INVENTION

Bearing in mind the foregoing, it is a principal object of the invention to provide a component lead processor cutting and forming tool for precision forming and trimming of integrated circuit sockets, transistors, capacitors, resistors and the like.

Another object of the invention is to utilize linear motion to achieve trimming of each lead of a component in a manner identical to that in which all other leads are trimmed, thereby permitting precise uniformity of the resultant trimmed leads.

Another object of the invention is to utilize said linear motion with staggered positioning of the leads such that substantially uniform force can be applied to the cutting surfaces or blades to enhance the foregoing uniformity.

One more object of the invention is to provide the foregoing objects and advantages in the form of a device suitable for use either manually or as the operative portion of automatic or semi-automatic trimming and forming equipment utilized with mass production techniques and driven with electrical, pneumatic, or similar external power means.

An additional object of the invention is also to accomplish all of the foregoing objects and advantages utilizing readily interchangeable dies for different component lead arrangements, which dies are provided with holes arranged on a staggered or angled orientation with respect to the linear motion of the cutting surfaces to equalize the cutting force required, further enhancing uniformity of the result.

Recognizing that cutting is accomplished by all devices of the type of this invention by shear, one more object of the invention is to accomplish all of the foregoing with cutting surfaces or blades which are maintained in close contact with each other by a resilient urging means such as a spring to enhance the uniformity and effectiveness of the shear cutting operation.

Another object of the invention is to provide a design for a low maintenance, low cost, high reliability, versatile, and efficient tool which may be interchangeably utilized both in automatic or semi-automatic trimming and forming machines as used in mass production, or in the form of a manual device that can be used with breadboarding, prototype assembly, low volume manufacture, or in remote or difficult to reach locations where external power sources may be unavailable or inconvenient.

Other objects and advantages will be apparent to those skilled in the art upon reference to the drawings, the following description and the appended claims.

In accordance with a principal aspect of the invention, there is provided a device comprising a housing, in which is disposed positioning means and a movable plunger to which is attached a cutter blade. Also in contact therewith are resilient urging means to maintain close contact for effective shear cutting between the cutter blade and a die removably, but in fixed position, attached to the housing. The die incorporates holes or perforations into which the component leads are inserted for trimming, a plurality of holes normally being utilized in positions that correspond to the position of such leads on said component. The die is also of predetermined thickness, which thickness establishes the length to which the leads are trimmed in accordance with the specifications and the thickness of the PC board to which the component will subsequently be soldered. The holes or perforations in the die will preferably be staggered or disposed in an angular orientation to the linear motion of the cutter blade with respect to the die such that each component lead will be severed in an identical angle, and in timed sequence to equalize the pressure required to do so throughout the stroke of the cutter blade. Of course, the inventive device further includes a plurality of fastening devices to connect the foregoing parts in place with each other. Further, a slot is provided in the base of the housing such that the severed pieces of the lead can exit the inventive device and thus not clog the same with scrap. Finally, optional mounting surfaces may be provided on the plunger and housing such that the device may be fixedly or removably attached to automatic or semi-automatic and externally powered trimming and forming equipment utilized in mass production facilities.

The invention will be still better understood upon reference to the following detailed description and drawings in which:

DETAILED DESCRIPTION

Figure 1:
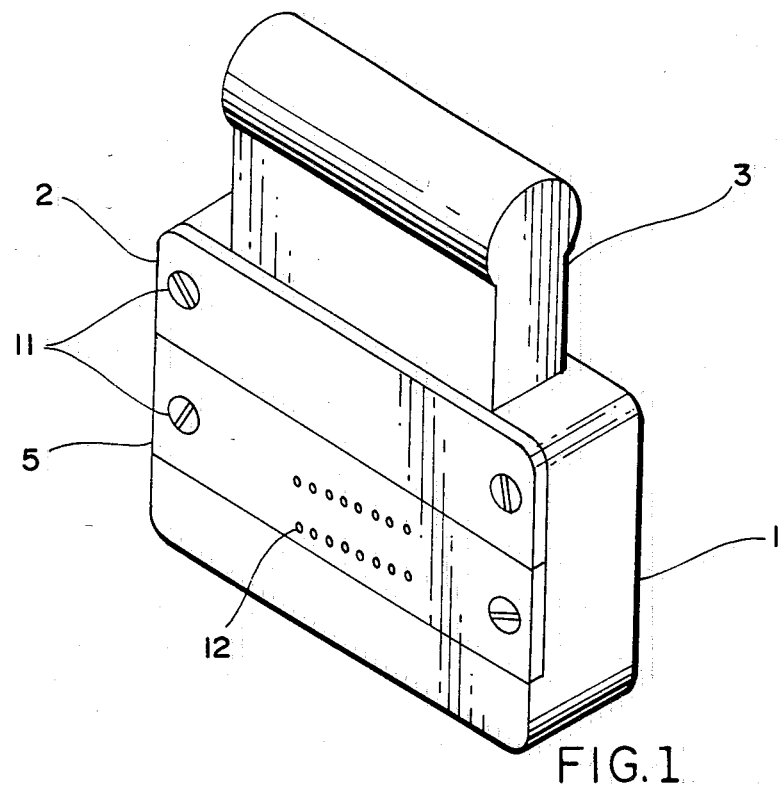
FIG. 1 is an isometric view of the manual, and preferred, embodiment of the invention.

FIG. 1 discloses a housing 1 to which is removably attached a top cover 2 untilizing retaining screws 11. Also removably attached to housing 1 is a perforated product die 5, also held with retaining screws 11, and in which is disposed a plurality of holes 12 into which it is intended that the electronics component lead will be inserted for trimming. It will be seen that the arrangement of the holes 12 is preferably with a staggered or angled orientation for reasons elsewhere herein described.

Figure 2:
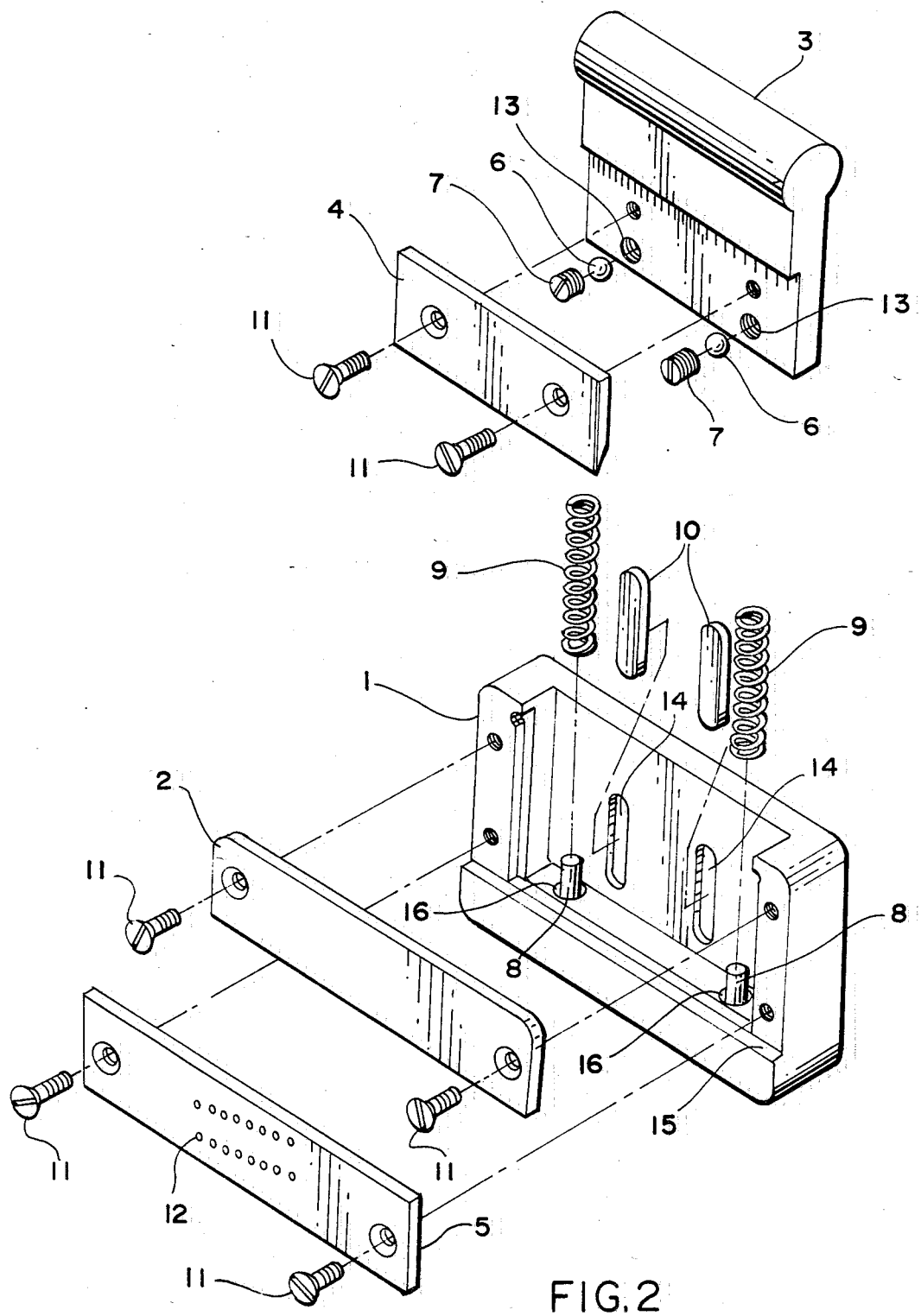
FIG. 2 is an exploded isometric view of the same preferred embodiment.

Turning now to FIG. 2, it will be seen that the housing 1 is hollowed out to accept in close fitting, but movable, relationship plunger 3 to which is removably attached cutter blade 4. Cutter blade 4 and plunger 3 are connected using retaining screws 11, as above described in regard to FIG. 1. Prior to attachment thereto, however, it will be seen that plunger 3 also contains threaded perforations 13 in which are disposed tension ball bearings 6, and tension set screws 7. Threaded perforations 13 completely penetrate plunger 3 such that tension ball bearings 6 may be inserted therein, and tension set screws 7 are placed in threaded engagement in threaded perforations 13 to position tension ball bearings 6 near the rear of threaded perforations 13 so that the surfaces of ball bearing 6 may come in contact with tension ball wear blocks 10, which are disposed in similarly shaped grooves 14 inside of housing 1. Thus, when plunger 3 is moved in relation to housing 1, tension ball bearings 6 exert pressure on tension ball wear blocks 10 thereby creating pressure between plunger 3 and housing 1. Obviously, the tension ball wear blocks 10 are preferably fabricated from a surface hardened material which enables tension ball bearings 6 to ride in an up and down motion as plunger 3 is movably operated within housing 1. The above-described pressure is then transmitted to cutter blade 4 which has been attached to plunger 3.

Also attached to housing 1, as described in FIG. 1, is a perforated product die 5, which is held with retaining screws 11 in fixed, but removable, position with respect thereto. Perforated product die 5 is thusly positioned in a plane adjacent, but in close proximity, to the plane of motion of cutter blade 4. Thus, when an object such as an electronics component lead is inserted into holes 12 and perforated product die 5 and extends therethrough, it will be subjected to a shearing action when cutter blade 4 moves linearly past the inside surface of perforated product die 5. Since cutter blade 4 is attached to plunger 3, the shearing action is enhanced by reason of the pressure created between plunger 3 and housing 1 utilizing tension set screws 7, tension ball bearings 6, and tension ball wear blocks 10.

It will be seen that since perforated product die 5 is removable, the thickness and placement of holes therein may be varied according to the requirements of the electronics component whose leads are being trimmed, and the desired length thereof after trimming. Thus it is possible to readily change the configuration of the electronics component whose leads are being trimmed, and the desired length thereof after trimming.

Disposed adjacent to perforated product die 5, and also connected to housing 1 with retaining screws 11, is top cover 2 which is also removably attached to housing 1 to facilitate the servicing of the internal moving parts of the invention. Perforated product die 5 is firmly held between boss 15 of housing 1 and top cover 2 to ease the lateral force applied to the retaining screws 11 that hold perforated product die 5 as the shearing action above described occurs.

Disposed withing housing 1 are recesses 16 in which are mounted guides 8 about which are disposed resilient urging means 9. Resilient urging means 9 are utilized for the purpose of returning plunger 3 and connecting parts including cutter blade 4 to their position of origin after shearing action has taken place between cutter blade 4 and perforated product die 5. Resilient urging means 9 are illustrated as coil springs, but may be of any other structure reasonably suited to the aforementioned function.

Figure 3:
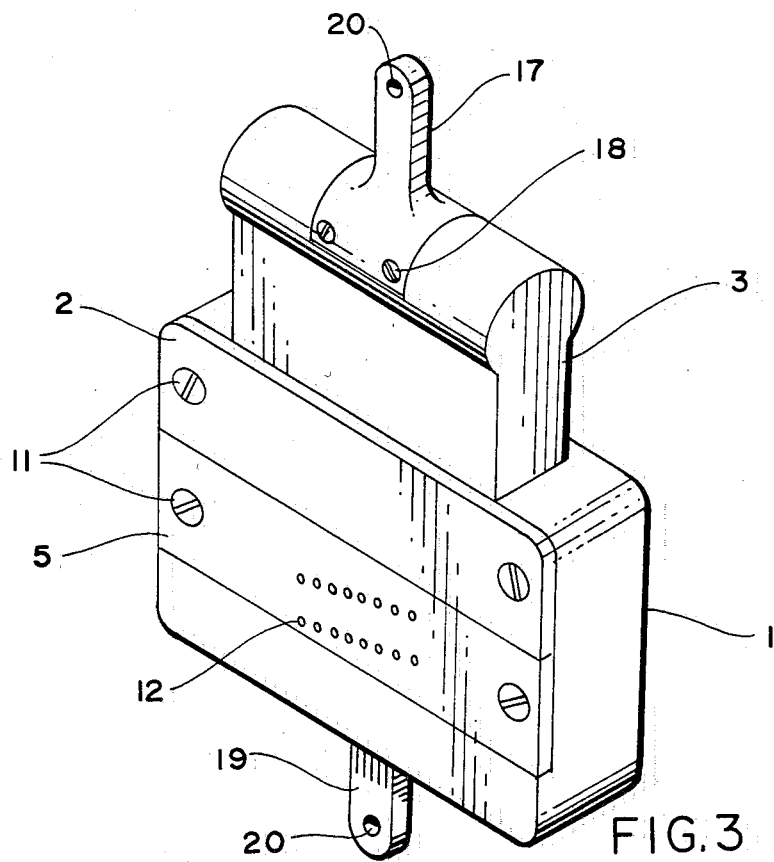
FIG. 3 is an isometric view of an alternative embodiment of the invention showing its utilization in automatic or semi-automatic, externally powered trimming and forming equipment.

FIG. 3 illustrates an alternative embodiment of the invention in which the assembled invention shown in FIG. 1 is provided with fittings to render it suitable for use in mass production manufacturing using automatic or semi-automatic trimming and forming equipment that may utilize solenoids, pneumatic cylinders, or the like for operation thereof. These fittings are illustrated in the form of an upper post 17 which is attached to the plunger 3 utilizing post connecting means 18. The lower portion of the housing 1 is similarly equipped with a lower post 19 attached thereto in similar manner. Disposed near the ends of the upper post 17 and lower post 19 are apertures 20. Apertures 20 are utilized for connecting the invention to mating portions of a pneumatically operated press, or the like, the nature of which is well known, not part of the invention, and consequently not illustrated.

Having described the presently preferred embodiment and one alternative embodiment of the invention, the advantages and objects of the invention will be apparent to those skilled in the art and reasonably modifications thereto are fully contemplated herein without departing from the true spirit of the invention. Accordingly, there are covered all alternatives, modifications, and equivalents as may be included within the spirit and scope of the invention as defined solely by the appended claims.

What is claimed is:
1. A tool comprising:
 a housing;
 a plunger in close fitting, but linearly movable, relationship to the housing and disposed in a hollowed out portion of said housing;
 a cutter blade attached to the plunger;
 a perforated product die attached to the housing and positioned in a plane adjacent, but in close proximity to, a plane of linear motion of the cutter blade to effect shearing action therewith, said die being of a predetermined thickness and containing holes through which electronics components leads may project into the plane of shearing action; and
 said tool further being characterized in that the holes of the product die are disposed in staggered relationship to the linear motion of the cutter blade.

2. The tool of claim 1 which further comprises resilient urging means disposed between the plunger/cutter blade and housing and tending to return the plunger/cutter to a point of origin after shearing action has occurred.

3. The tool of claim 1 which further comprises pressure creating apparatus including:
 at least one threaded perforation disposed within the plunger;
 at least one tension set screw in threaded engagement with said perforation;
 at least one tension ball bearing positioned within and near the rear of the threaded perforation;
 at least one groove disposed interiorly of the housing and in proximity to the tension ball bearing; and
 at least one tension ball wear block positioned within the groove such that advancing the set screw within the threaded perforation causes the tension ball bearing to put pressure on the tension ball wear block, thereby creating pressure between the plunger/cutter blade and perforated product die to enhance shearing action.

4. The tool of claim 1 in which the perforated product die is removably attached to the housing so it can be readily replaced with dies having different hole patterns and different thicknesses, thus altering length of resulting electronics components leads after trimming.

5. The tool of claim 1 in which the cutter blade is removably attached to the plunger so it may be readily removed for sharpening.

6. The tool of claim 1 which further comprises a top cover removably detachable from the housing to permit servicing of internal moving parts, said top cover also furnishing lateral support to the perforated product die.

7. The tool of claim 1 which further comprises:
 a upper post connected to the plunger;
 a lower post connected to the housing; and
 apertures in upper and lower posts for connection thereof to mating portions of externally powered mass production equipment.

* * * * *